US011521680B2

(12) United States Patent
Garcia Redondo et al.

(10) Patent No.: US 11,521,680 B2
(45) Date of Patent: Dec. 6, 2022

(54) MEMORY DEVICE WITH ON-CHIP SACRIFICIAL MEMORY CELLS

(71) Applicant: Arm Limited, Cambridge (GB)

(72) Inventors: Fernando Garcia Redondo, Cambridge (GB); Mudit Bhargava, Austin, TX (US); Pranay Prabhat, Cambridge (GB); Supreet Jeloka, Austin, TX (US)

(73) Assignee: Arm Limited, Cambridge (GB)

( * ) Notice: Subject to any disclaimer, the term of this patent is extended or adjusted under 35 U.S.C. 154(b) by 101 days.

(21) Appl. No.: 17/139,059

(22) Filed: Dec. 31, 2020

(65) Prior Publication Data
US 2022/0208265 A1 Jun. 30, 2022

(51) Int. Cl.
G11C 11/00 (2006.01)
G11C 13/00 (2006.01)
G11C 11/16 (2006.01)

(52) U.S. Cl.
CPC ...... *G11C 13/0064* (2013.01); *G11C 11/1675* (2013.01); *G11C 11/1677* (2013.01); *G11C 13/0069* (2013.01)

(58) Field of Classification Search
CPC ............ G11C 13/0064; G11C 11/1675; G11C 13/0069; G11C 11/02; G11C 13/0002; G11C 13/00
See application file for complete search history.

(56) References Cited

U.S. PATENT DOCUMENTS 6,791,873 B1 * 9/2004 Perner ..................... G11C 11/15
365/158
2018/0342306 A1 * 11/2018 Huang ............... G11C 16/3495
2021/0090681 A1 * 3/2021 Harms .................. G11C 29/70

OTHER PUBLICATIONS

C. Lee, Y. Song and Y. Shin, "Endurance Enhancement of Multi-Level Cell Phase Change Memory," 2019 IEEE/ACM International Conference on Computer-Aided Design (ICCAD), Westminster, CO, USA, 2019, pp. 1-8.
K. Lee et al., "1Gbit High Density Embedded STT-MRAM in 28nm FDSOI Technology," 2019 IEEE International Electron Devices Meeting (IEDM), San Francisco, CA, USA, 2019, pp. 2.2.1-2.2.4.
M. Mao, Y. Cao, S. Yu and C. Chakrabarti, "Optimizing Latency, Energy, and Reliability of 1T1R ReRAM Through Cross-Layer Techniques," in IEEE Journal on Emerging and Selected Topics in Circuits and Systems, vol. 6, No. 3, pp. 352-363, Sep. 2016.
(Continued)

*Primary Examiner* — Uyen Smet
(74) *Attorney, Agent, or Firm* — Leveque Intellectual Property Law, P.C.

(57) ABSTRACT

An integrated circuit includes a primary memory array with cells switchable between first and second states. The circuit also includes sacrificial memory cells; each fabricated to be switchable between the first and second states and associated with at least one row of the primary array. A controller is configured to detect a write operation to a row of the primary array, stress a sacrificial cell associated with the row and detect a failure of the associated sacrificial cell. The sacrificial cells are fabricated to have lower write-cycle endurance than cells of the primary array or are subjected to more stress. Failure of a row of the primary array is predicted based, at least in part, on a detected failure of the associated sacrificial cell.

18 Claims, 8 Drawing Sheets

(56) References Cited

OTHER PUBLICATIONS

P. Huang et al., "Analytic model of endurance degradation and its practical applications for operation scheme optimization in metal oxide based RRAM," 2013 IEEE International Electron Devices Meeting, Washington, DC, 2013, pp. 22.5.1-22.5.4.

Y. Wang et al., "Compact Model of Dielectric Breakdown in Spin-Transfer Torque Magnetic Tunnel Junction," in IEEE Transactions on Electron Devices, vol. 63, No. 4, pp. 1762-1767, Apr. 2016.

* cited by examiner

MEMORY DEVICE WITH ON-CHIP SACRIFICIAL MEMORY CELLS

BACKGROUND

The cells of computer memory devices may fail after being subject to a large number of write cycles. The expected number of cycles that a cell can withstand is called its expected cycle endurance. The cycle endurance is dependent upon both manufacturing and operational factors. While mechanisms (such as error correcting codes) exist for detecting errors due to cell failure after they occur, these mechanisms do not predict failures and may not prevent data from being lost.

BRIEF DESCRIPTION OF THE DRAWINGS

The accompanying drawings provide visual representations which will be used to more fully describe various representative embodiments and can be used by those skilled in the art to better understand the representative embodiments disclosed and their inherent advantages. In these drawings, like reference numerals identify corresponding or analogous elements.

DETAILED DESCRIPTION

Figure 1:
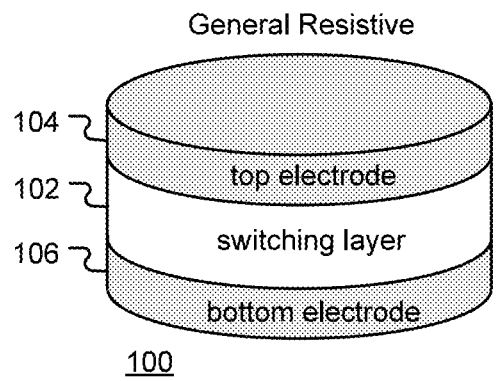
FIG. 1 is a diagrammatic representation of a memory cell.

The various apparatus and devices described herein provide mechanisms for predicting failure of a computer memory using on-chip sacrificial memory cells.

While this present disclosure is susceptible of embodiment in many different forms, there is shown in the drawings and will herein be described in detail specific embodiments, with the understanding that the embodiments shown and described herein should be considered as providing examples of the principles of the present disclosure and are not intended to limit the present disclosure to the specific embodiments shown and described. In the description below, like reference numerals are used to describe the same, similar or corresponding parts in the several views of the drawings. For simplicity and clarity of illustration, reference numerals may be repeated among the figures to indicate corresponding or analogous elements.

Computer memory has a number of characteristics including operating voltage, energy consumption, cycle endurance, retention time, scalability, cost etc. For example, for some applications the memory is designed to use a low operating voltage (one Volt or less) and have low energy consumption, while for some applications a high cycle endurance ($10^{15}$ cycles or more) is required. In addition, non-volatile memory should also have a long data retention time (more than ten years, for example).

Computer memory is often implemented as a memory array in an integrated circuit. The memory array may be arranged as a number of rows, each row including multiple memory cells. Each memory cell is switchable between a first state and a second state in response to a write operation, where the first state represent a logic value '1' and the second state represents the logic value '0'.

Cycle endurance is the expected number of switch or state change cycles that a memory cell can perform before it can no longer be switched between states. That is, the cycle endurance is the expected number of switch cycles that a memory cell can perform before the cell fails to be switchable.

In accordance with certain embodiments of the disclosure, the integrated circuit containing the memory arrays also includes failure prediction circuitry. The failure prediction circuitry includes sacrificial memory cells that, like the cells of the primary array, are fabricated to be switchable between the first state and the second state. Each sacrificial memory cell is associated with at least one row of the memory array. The failure prediction circuitry also includes a controller configured to detect a write operation to one row of the memory array. Based on the detected write operation, the controller switches a sacrificial memory cell associated with the row between the first state and the second state. The controller is also configured to detect a failure of the associated sacrificial memory cell to be switchable between the first state and the second state. A detected failure of the associated sacrificial memory cell is predictive of a failure in at least one row of the memory array.

The failure detection circuitry is configured such that a sacrificial memory cell is likely to fail before an associated cell in the primary memory array. This may be done by fabricating the sacrificial memory cell to be less durable, or by stressing the sacrificial memory cell more than the associated cells of the primary memory array. Increased stressing may be applied, for example, by using higher level switching voltage or current, applying the voltage or current for a longer duration, or switching the cell more often.

The failure detection circuitry may be used with various types of memory. The cells of the primary memory array and the sacrificial memory cells are of the same type. However, fabrication differences between the cells of the primary memory array and the sacrificial memory cells may be designed dependent on the type of memory.

Some memories, such as static random access memory (SRAM), dynamic random access memory (DRAM), ferroelectric random access memory (FeRAM) and Flash memory, store information as the presence or absence of an electrical charge or the state of logic gates. Other memories, such as phase change memory (PCM), resistive random access memory (RRAM) and correlated electron random access memory (CeRAM), store information as a high or low electrical resistance state. Other memories store information as the polarization of a magnetic field, these include older technologies, such as core memory, and memories that use newer technologies such as magneto-resistive random access memory (MRAM) including spin-transfer torque MRAM (STT-MRAM). There is some overlap in the technologies in that the electrical resistance of an MRAM cell is dependent upon the magnetization direction determines the resistance.

FIG. 1 is a diagrammatic representation of a single memory cell 100. The cell includes switching layer 104 located between bottom electrode 106 and top electrode 108. Switching layer 104 is switchable between a first state, such as a high resistance state, and a second state, such as a low resistance state. Typically, the state is switched by applying a write voltage across the switching layer. The state of the cell may be read by measuring the electrical resistance of the cell. This may be done, for example, by applying a read voltage across the cell. A low resistance state (LRS) may correspond to a logic value 1 and a high resistance state (HRS) to a logic value 0, or vice versa. Thus, memory cell 100 stores one bit of information.

PCM typically uses a chalcogenide material (commonly $Ge_2$—$Sb_2$—$Te_5$, GST) in switching layer 102 and relies on the difference in resistance between the crystalline phase and amorphous phase for efficient data storage capability. In a crystalline phase the cell is in a low resistance state (LRS) or ON state, whereas in the amorphous phase the cell is in a high resistance state (IRS) or OFF state. The SET operation produces the LRS and corresponds to storing the logic value '1', whereas the RESET operation produces the HRS and corresponds to storing the logic value '0' in the device. For the SET operation, PCM is heated above its crystallization temperature on the application of voltage pulse, while for RESET operation, a larger electrical current is passed through the cell and then abruptly cut-off so as to melt and then quench the material in order to achieve the amorphous state.

In RRAM, switching layer 102 consists of an insulating layer sandwiched between top and bottom electrodes 104 and 106, respectively. RRAM relies on the formation and the rupture of conductive filaments corresponding to LRS and HRS, respectively, in the insulator between the two electrodes.

In CeRAM, switching layer 102 utilizes a quantum phase transition, referred to as a Mott transition, which exists in carbon-doped transition metal oxide (TMO) materials. The transition produces a large change in resistance due to a voltage and current induced shift in the occupancy of electron orbitals surrounding each metal ion.

In MRAM, switching layer 102 may use a magnetic tunnel junction (MTJ) as the storage element.

Figure 2:
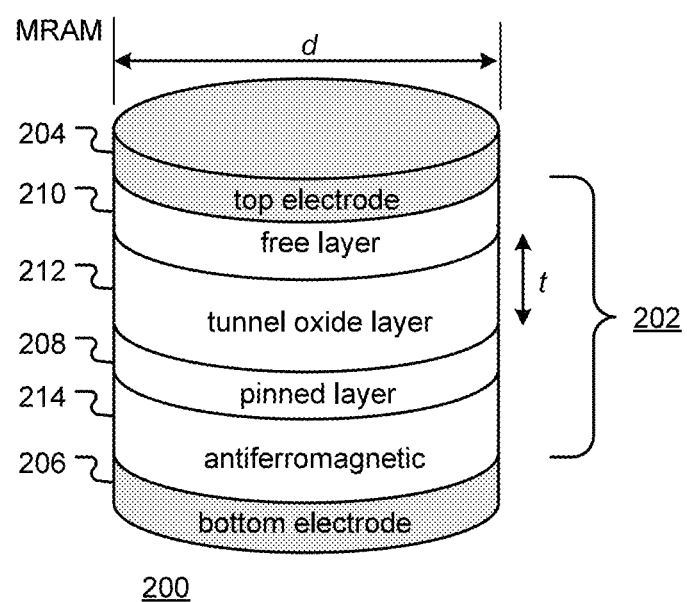
FIG. 2 is a diagrammatic representation of a magneto-resistive memory cell.

FIG. 2 shows a more detailed representation of an example MRAM cell 200. MRAM cell 200 includes switching layer 202, coupled to top electrode 204 and bottom electrode 206. Switching layer 202 includes magnetically pinned ferromagnetic layer 208 in which the polarization of the magnetic field is in a fixed direction, and magnetically free ferromagnetic layer 210, in which the polarization of the magnetic field is switchable between a direction that is parallel (referred to as the 'P' state) to the polarization direction of pinned ferromagnetic layer 208 and a direction that is anti-parallel (referred to as the 'AP' state) to the polarization direction of pinned ferromagnetic layer 208. The ferromagnetic layers may be materials such as MgO or $Al_2O_3$, for example.

Tunnel oxide layer 212 is a thin dielectric layer that supports quantum mechanical tunneling of spin-polarized electrons through the layer. Tunnel oxide layer 212, pinned ferromagnetic layer 208 and free layer 210, together, form a magnetic tunnel junction (MTJ). The relative magnetization orientation of two ferromagnetic layers separated by the dielectric layer determines the resistance of the MTJ structure. MRAM cells are designed to have two stable magnetic states that correspond to high or low resistance values and retain those values without any applied power. The cells are read by sensing the resistance to determine if the state is high or low, while the writing is carried out by the magnetic fields generated from the current flowing in the bit and word lines. Antiferromagnetic layer 214 prevents disturbance of the magnetization direction of pinned ferromagnetic layer 208.

Application of an external electromagnetic field can change the magnetization direction of free ferromagnetic layer 210. When pinned layer and the free layer have the same direction of magnetization, the MTJ is in the parallel or LRS. When directions of the magnetization of two ferromagnetic layers are anti-parallel, the MTJ is in the HRS.

The operating characteristics of MRAM cell 200 are dependent, at least, upon the cross-dimension, d, of the stack and the thickness, t, of tunnel oxide layer 212.

In designing memory devices, there is often a conflict between different desirable characteristics. For example, switching pulses are applied to switch between high and low resistance states or between magnetic polarizations. Shorter pulses are desirable for higher speed switching, but required higher voltage or current levels. Better data retention requires higher switching thresholds levels, again requiring higher voltage or current levels. This is in conflict with the cycle endurance of the memory, since the cycle endurance is affected by level and duration of the switching pulse. If the level of the switching pulse is increased for higher speed and/or longer data retention, the probability of cell failure is increased.

In the sequel, the disclosure is described with reference to an implementation in an MRAM device. However, the disclosure is not so limited and may be used in other types of memory devices, such as PCRAM, FeRAM, CeRAM, RRAM and other types of non-volatile memory (NVM) or volatile memory (VM). For example, a memory cell may be a non-volatile memory cell (NVM cell), the primary memory array may be a non-volatile memory array (NVM array) and a sacrificial memory cell may be a non-volatile sacrificial memory cell (NVM sacrificial cell).

Figure 3:
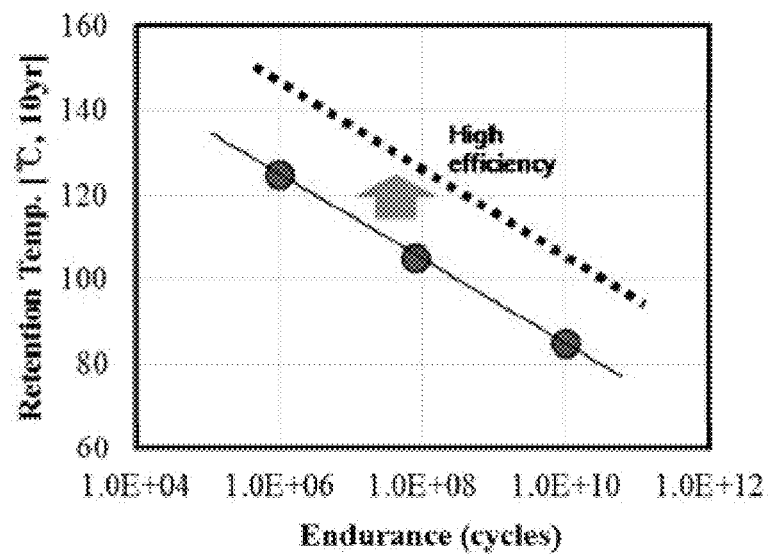
FIG. 3 is a graph showing a relationship between memory cell retention temperature and memory cell cycle endurance.

FIG. 3 is a graph showing a relationship between memory cell retention temperature and memory cell cycle endurance for an STT-MRAM memory cell. The retention temperature is the maximum temperature (° C.) at which a cell can retain information for a period of ten years. The endurance is the number of switching cycles. The graph shows that temperature adversely affects endurance. This make it difficult to predict the endurance of a memory device, since the temperatures to which is will be exposed are unknown.

Cycle endurance is dependent on the stress suffered by the cell, such as the amplitude and duration of the pulses exciting the cell, and the fabricated ability of the cell to withstand such stress. The ratio of the number of faulty cells to the number of functioning cells is dependent on voltage/current amplitude and duration in addition to the structure of the cell. This parameter may be estimated from the design parameters.

An embodiment of the disclosure uses sacrificial memory cells close to the memory blocks of a memory array. Since the sacrificial memory cells are fabricated in the same integrated circuit (chip) as the primary memory array, they are exposed to the same process and temperature variations. However, the sacrificial memory cells are engineered or stressed such that they will fail before cells in an associated region of the primary memory array.

Figure 4:
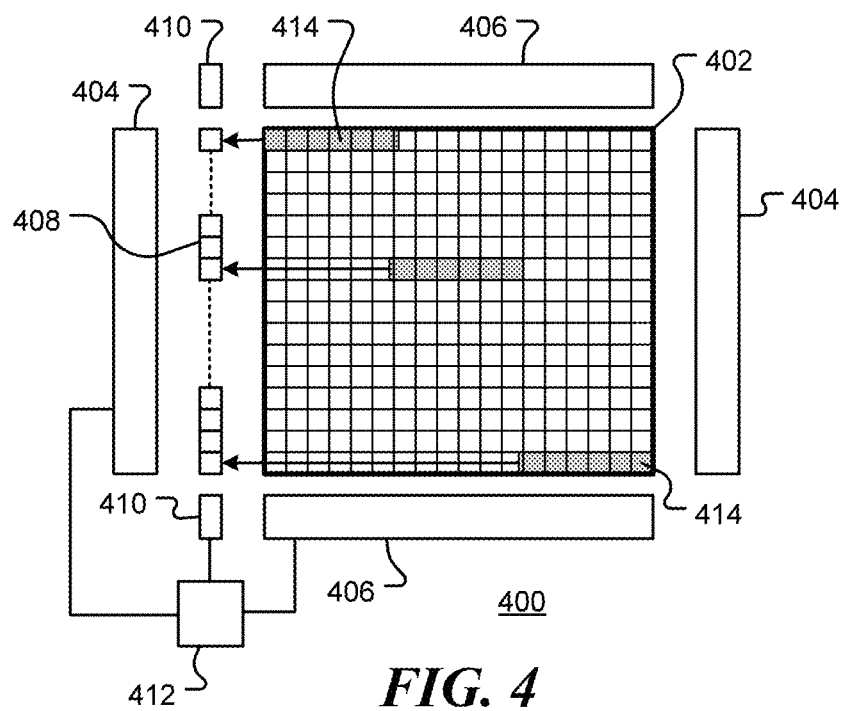
FIG. 4 is a diagrammatic representation of an integrated circuit memory device including sacrificial memory cells, in accordance with embodiments of the disclosure.

FIG. 4 is a diagrammatic representation of an integrated circuit 400 including sacrificial memory cells, in accordance with embodiments of the disclosure. Integrated circuit 400 includes a primary memory array 402 and associated peripheral circuitry. Memory cell in primary memory array 402 are switchable between a first state and a second state responsive to a write operation. The peripheral circuitry includes row circuitry 404, such as word lines coupled to rows of the memory array, and column circuitry 406, such as bit lines coupled to columns of the memory array. In accordance with an embodiment of the disclosure, integrated circuit 4(x) also includes failure prediction circuitry. The failure prediction circuitry includes sacrificial memory cells 408, associated peripheral circuitry 410 and a controller 412. Sacrificial memory cells 408 are also switchable between the first state and the second state and have the same, or similar, structure as the cells in the primary memory array.

The peripheral circuitry 410 for the sacrificial memory cells 408 may be included in the peripheral circuitry (404 and 406) or provided as a separate module, for example. This enables fabrication of a highly integrated memory device, or allows the sacrificial cells and associated peripheral circuitry to be provided as a separate intellectual property (IP) block.

In one embodiment, the sacrificial memory cells 408 are engineered such that they will fail before cells in the primary memory array. That is, the sacrificial memory cells 408 are fabricated to have lower write-cycle endurance. For example, for an MRAM cell, the magnetic tunnel junction (MTJ) could be fabricated with a thinner oxide or the MTJ stack could be fabricated with a smaller cross-sectional area or cross-dimension—such as a smaller diameter for a cylindrical stack. A smaller cross-sectional area or cross-dimension increases the current density in the cell so that the cell is stressed more in each switching cycle.

Multiple types of sacrificial cells may be associated with the same row, with different probabilities of failure. For example, a type 1 sacrificial cell may be fabricated to fail before a type 2 cell. Failure of a type 2 sacrificial cell is predictive of a failure of an associated primary cell sooner than failure predicted by failure in a type 1 cell, and may trigger a different mitigation response. Controller 412 is configured to stress the sacrificial memory cells in operation such that they will fail before cells in an associated region of the primary memory array. The controller detects a write operation to the primary memory array 402 and switches the one or more sacrificial memory cells between the first state and the second state based on the detected write operation. A sacrificial memory cell 408 may be associated with a designated sub-block (e.g. region 414) of the primary memory array. The controller monitors access to the sub-block and determines when the associated sacrificial memory cell should be switched. For example, when the sacrificial memory cell is fabricated to be less durable than the primary memory, the sacrificial memory cell may be switched each time the sub-block is written to. When the sacrificial memory cell is fabricated to have the same durability as the primary memory, the sacrificial memory cell may be switched more often than the sub-block. Depending on the technology of the sacrificial memory cell, a low-current reset operation might be used before the next stressing operation takes place. This might be the case for STT-RAM, for example.

The sacrificial cells may be stressed more often than the cells of the primary array. For example, the cells may be stressed each time an associated primary cell is written and, in additional, at selected additional times (e.g. during idle periods).

The sacrificial cells may be stressed at a higher level than then cells of the primary arrays. This may be done by applying a higher voltage. The higher voltage may be generated by various means, such as reducing the resistance of the associated selector device, bit-line or source-line. For example, the bit-line and/or source line may have an increased width, increased thickness or multiple layers. In a further embodiment, a selector with a lower threshold voltage may be used to reduce its on resistance, again increasing the voltage applied to the sacrificial cells.

The level of stress applied to the sacrificial cells may be gradually increased over the lifetime of the memory device.

The controller reads the sacrificial memory cell after it is switched to detect a failure or other defect. In particular, failure is detected when a sacrificial memory cell is no longer switchable between the first and second states (logic values 0 and 1). This is in contrast with techniques for checking operating conditions where, for example, a test cell is used to set a data retention voltage for static random access memory (SRAM). In those techniques, the test cell itself does not fail and remains switchable.

Failure of a sacrificial memory cell to be switchable between the first state and the second state is an indication that the primary memory array may be getting close to failure. Based on the failure of one or more sacrificial memory cells, the controller predicts failure of at least a sub-block of the primary memory array and takes an appropriate action. For example, the controller may generate an interrupt signal, copy data from sub-blocks for failure is predicted to another location, or mark the sub-block as malfunctioning, etc.

Figure 5:
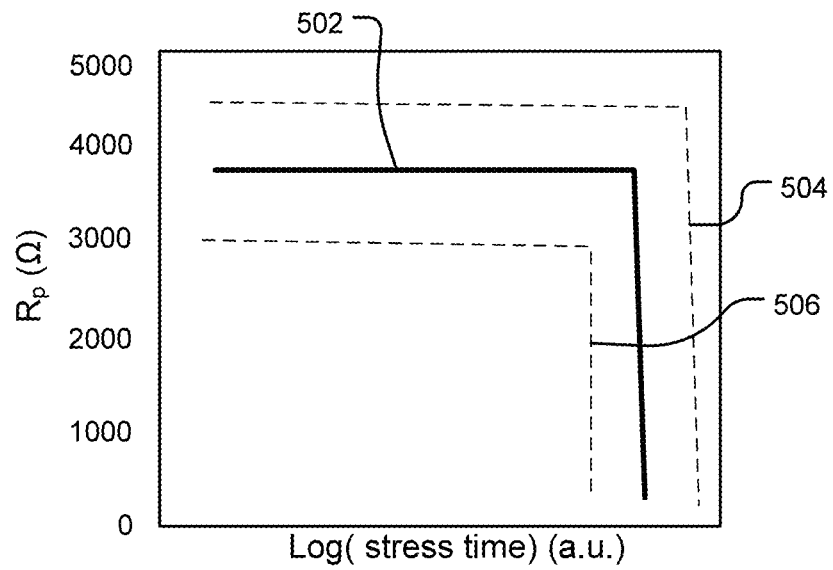
FIG. 5 is a graph showing a relationship memory cell electrical resistance and retention and stress time.

FIG. 5 is a graph showing a relationship memory cell electrical resistance and stress time. The resistance is shown in Ohms ($\Omega$), while the stress time is shown in arbitrary units. An example response, depicted as solid line 502 in the graph, shows that the resistance drops rapidly after some amount of stress, indicating that the cell has failed and is no longer functional. More generally, the response of different cells will vary. For example, line 504 shows the response of a cell with a higher initial resistance and line 506 shows the response of a cell with a lower initial resistance. This indicates that a cell with a lower resistance, such as a cell with a thinner oxide layer, is likely fail sooner than a cell with a higher resistance. In one embodiment, the failure prediction circuitry is configured such that the sacrificial memory cells are stressed for a longer time than required. In a further embodiment, a sacrificial memory cell is switched more frequently than the associated sub-block of the primary memory array.

Figure 6:
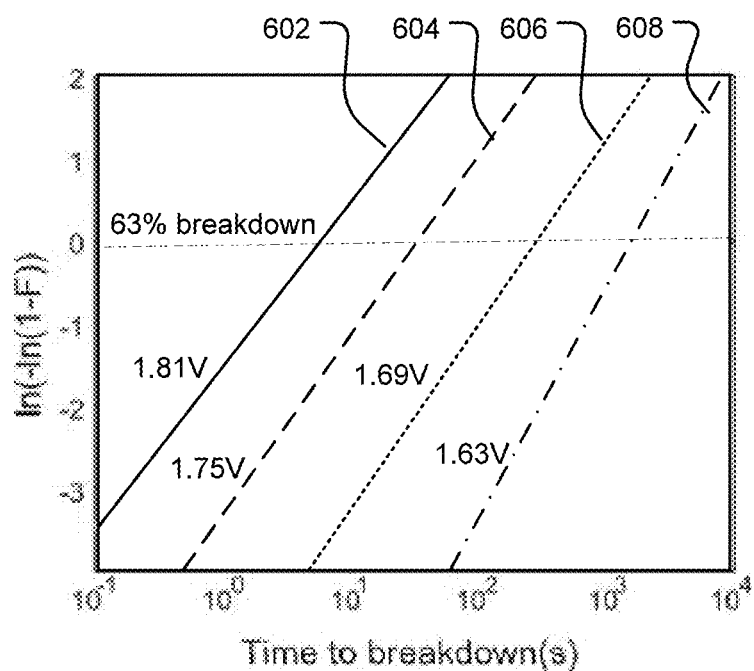
FIG. 6 is a graph showing the proportion of failed cells in a memory array as a function of time for different voltage levels.

FIG. 6 is a graph showing the proportion of failed cells in a memory array as a function of time for different voltage levels. The ratio of failed cells to total cells is denoted as F. The time to cell breakdown is shown in seconds. Plots 602, 603, 606 and 608 show the failure ratio as a function of time for voltages of 1.81V, 1.75V, 1.69V and 1.63V, respectively. It can be seen that the cell breaks down sooner at higher voltages. In one embodiment, the sacrificial memory cells are driven at a higher voltage or current than the cell cells in the primary memory array. The amount of overdrive may be determined such that the cell endurance is worsened by a designated amount. In this way, it is likely that a sacrificial memory cell will fail before cells in the associated sub-block of the primary memory. Thus, failure of the sacrificial memory cells may be used to predict failure of the associated primary memory cells.

In a further embodiment, the sacrificial memory cells are fabricated such that they are likely to fail before cells in the associated sub-block of the primary memory array, even when subjected to the same stresses.

Figure 7:
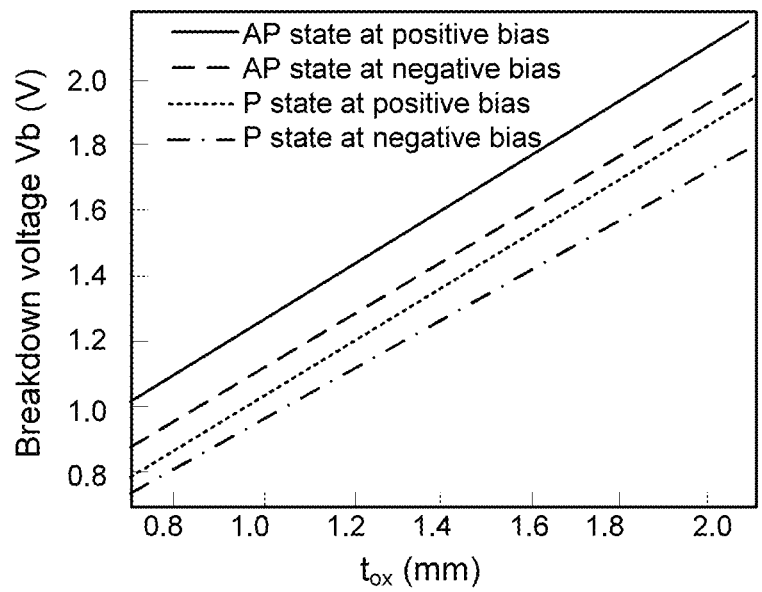
FIG. 7 is a graph showing a relationship between the thickness of an oxide layer in a magneto-resistive memory cell and breakdown voltage.

FIG. 7 is a graph showing a relationship between the thickness of an oxide layer in a magneto-resistive memory cell and breakdown voltage. The plot shows the breakdown voltage as a function of the thickness of an oxide layer for cells in the parallel (P) or anti-parallel (AP) state for positive and negative bias voltages. FIG. 7 indicates that cells with a thinner oxide layer breakdown at a lower voltage than cells having a thicker oxide layer. In one embodiment of the disclosure, the sacrificial memory cells are fabricated to have a thinner oxide layer than cells in the primary memory array. As a result, the sacrificial cells are likely to fail before cells in the primary memory array.

In a further embodiment, the switching element of a sacrificial memory cell is manufactured to have a smaller cross-sectional area (such as a smaller diameter or a smaller cross-dimension) than cells in the primary memory array. This increases the current density the sacrificial memory cells compared to that in the primary memory cells. Again, this makes it likely that a sacrificial memory cell will fail to be switchable before a cell in the associated sub-block of the primary memory array.

The fabrication process may result in significant variation between devices. For example, the thickness of the oxide may vary. In an embodiment of the disclosure, the controller of the failure prediction circuitry includes a look-up table that stores trimming values to indicate the desired operation points for the sacrificial memory cells.

While FIG. 4 depicts sacrificial memory cells adjacent to rows of the primary memory array, sacrificial memory cells can be placed around the global memory block. In one embodiment, the controller of the failure prediction circuitry determines which sacrificial memory cells are associated with which sub-block of the primary memory array. In this way, the failure prediction circuitry can warn/replace specific memory sub-blocks rather than failing the whole array. The use of more sacrificial memory cells and smaller sub-blocks enables more accurate prediction. For example, when a very large sub-block is used (1 Mbit, for example), the associated sacrificial memory cell does not distinguish between writing to each cell of the sub-block 10 times or writing to a single cell of the sub-block $10^7$ times. Accordingly, smaller sub-blocks many be used. In one embodiment, one sacrificial memory cells is used for each line of the array—which may be 64, 128, 256 or 512 bits, for example. In a further embodiment, a sub-block may be several lines of the array.

It is noted that smaller sub-blocks enable more accurate prediction. For example, with just one sacrificial per 1 Mb sub-block, if each cell is written 10 times the sacrificial memory cell will report a stress of $10^7$ cycles—the same as if a single cell in the sub-block were stressed $10^7$ times. A good calibration process together with the appropriate granularity would overcome this issue.

In a magnetic tunnel junction (MTJ), the most common failure mechanism is for the parallel state to not recover. However, cells that use other technologies, such as RRAM cells, may suffer from multiple failure sources.

Figure 8:
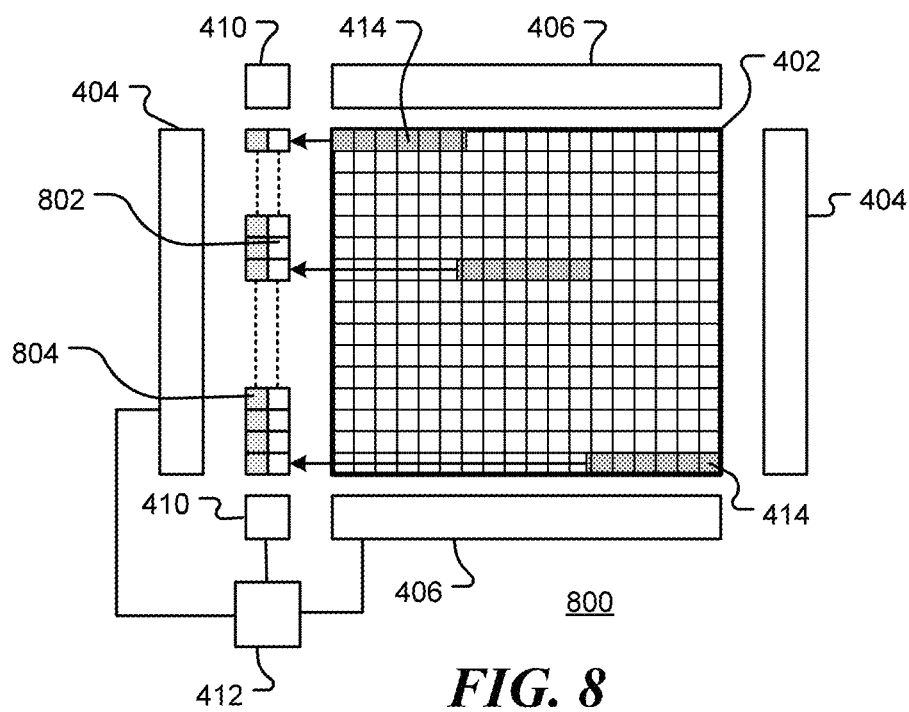
FIG. 8 is a diagrammatic representation of an integrated circuit memory device including sacrificial memory cells, in accordance with embodiments of the disclosure.

In one embodiment, shown in FIG. 8, different state changes are tracked. Memory device 800 is similar to that shown in FIG. 4 except that, for each sub-block 414, the transition from LRS to HRS (e.g. P2AP in MRAM) is tracked by a first sacrificial cell and the transition from HRS to LRS (e.g. AP2P in MRAM) is tracked by a second separate sacrificial memory cell. Assuming the HRS ('AP' in MRAM or 'R-off' in RRAM) represents logic value 0 and the LRS ('P' in MRAM or 'R-on' in RRAM) represents logic value 1, the first cell is stressed if data written to the sub-block contains at least one bit with the value 0 and the second cell is stressed if data written to the sub-block contains at least one bit with the value 1. The first sacrificial memory cells are denoted as cells 802 and the second sacrificial memory cells are denoted as cells 804. The cells may be fabricated at various other locations relative to the primary memory array 402.

Figure 9:
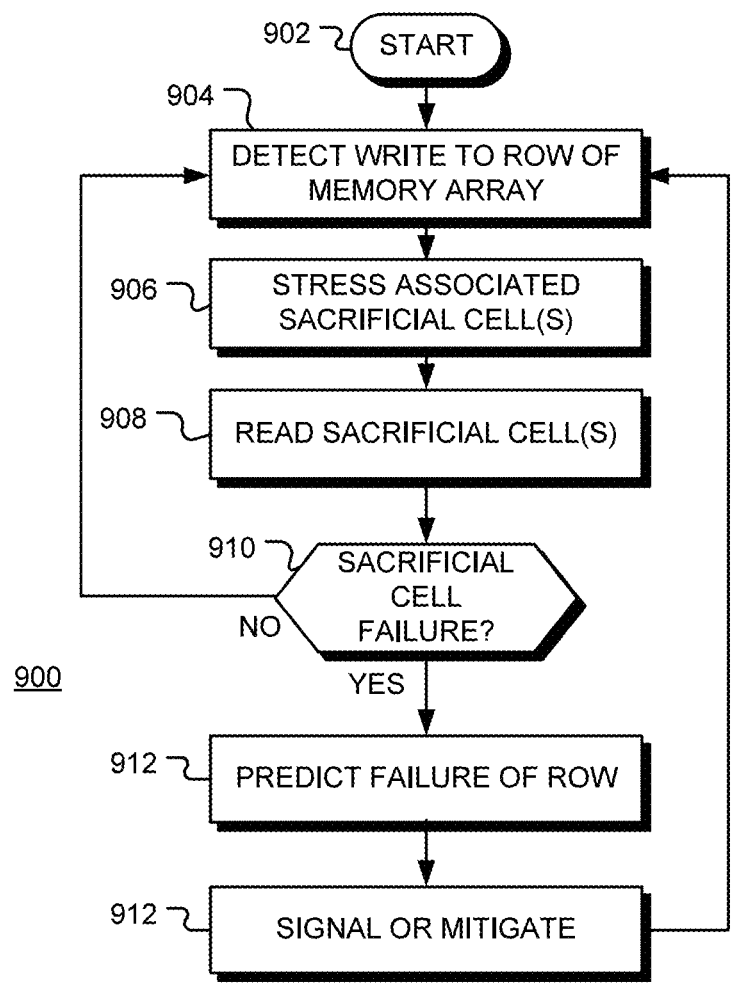
FIG. 9 is a flow chart of a method for predicting cell failure in memory device, in accordance with embodiments of the disclosure.

FIG. 9 is a flow chart of a method 900 for predicting cell failure in a memory device, in accordance with embodiments of the disclosure. Following start block 902, a write operation to a row of a memory array of an integrated circuit is detected at block 904. The row includes multiple memory cells. The write operation switches one or more cells of the row between a first state and a second state. Some cells may switch from 0 to 1, some from 1 to 0. Other cells may be left unchanged or rewritten with same value. Based on the detected write operation, one or more sacrificial memory cells associated with the row are stressed at block 906. This may be done, for example, by switching between the first state and the second state. At block 908, the sacrificial memory cells associated with the row are tested to see if they have functioned correctly. This may be done, for example, by reading the cell to verify that the attempted switching has occurred. In a resistive memory, stressing may involve attempting to switch the sacrificial cell from a low resistance to a high resistance. A failure is then detected if a measured resistance of the cell remains low. For sufficiently high voltage and current, this indicates breakdown of the cell. If one or more sacrificial memory cells have failed to be switchable between the first state and the second state, it is an indication that the corresponding row or rows of the primary memory array may also fail.

This method enables smart schemes to increase the system lifespan. For example, if '1's are written more often than '0's, and the first (P2AP) sacrificial memory cell detects a probable failure in the middle-future, encoding of the data could be inverted so that '0's are written more often, extending the life of the system.

Figure 10:
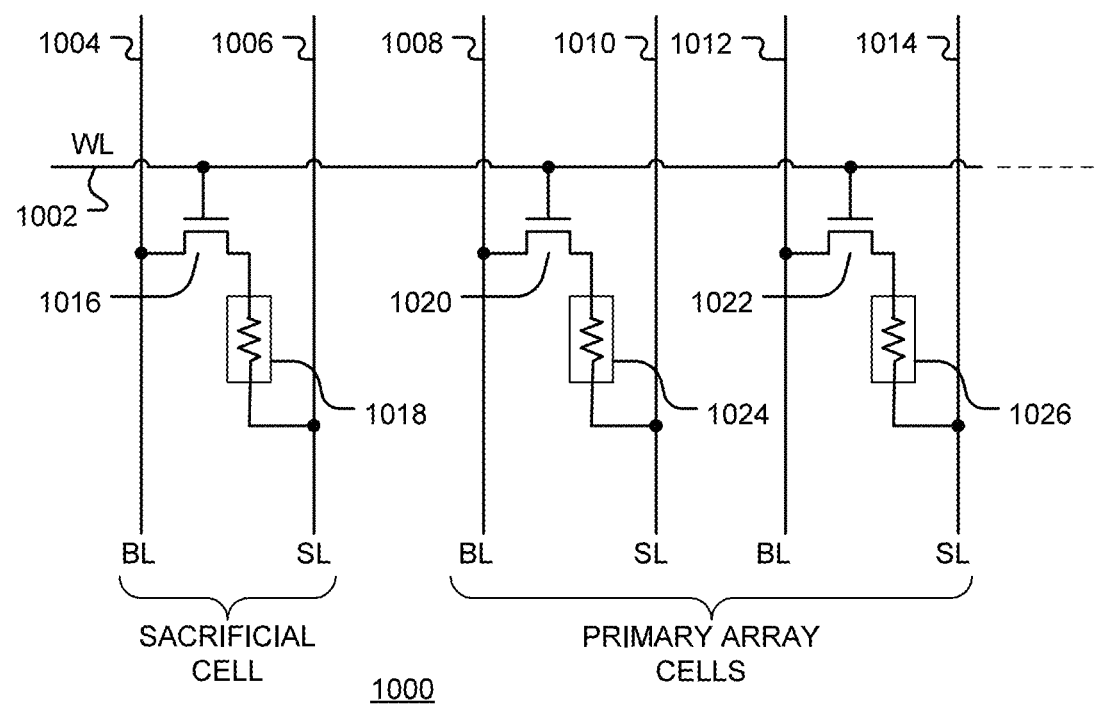
FIG. 10 is a diagrammatic representation of a row of an integrated circuit memory device including sacrificial memory cells, in accordance with embodiments of the disclosure.

FIG. 10 is a diagrammatic representation of a row 1000 of memory cells of an integrated circuit memory device including sacrificial memory cells, in accordance with embodiments of the disclosure. Row 1000 includes word line (WL) 1002, which is asserted to select the row for access to the sacrificial memory cell and cells of the primary array. In general, a row may include one or more sacrificial cells and a plurality of primary cells. In the figure, the sacrificial memory cell is coupled between bit line (BL) 1004 and sense line (SL) 1006, while a first memory cell of the primary array is coupled between bit line 1008 and sense line 1010 and a second memory cell of the primary array is coupled between bit line 1012 and sense line 1014. When the word line 1002 and bit line 1004 are asserted, transistor 1016 allows a voltage to be applied across resistive element 1018 of the sacrificial cell. Similarly, when the word line 1002 and bits lines 1008 and 1012 are asserted, transistors 1020 and 1022 allow voltages to be applied across resistive elements 1024 and 1026, respectively, of the primary array cells. The resulting currents on sense lines 1006, 1010 and 1014 can be measured to determine if the corresponding cell is in a high resistance state or a low resistance state. In this way, the sacrificial cell may be stressed at least as often as any cell in the same row of the array.

Overstressing a sacrificial memory cell could lead to "false positives", in which the controller issues an "endurance alert" that is not correlated with the endurance status of the memory block.

To reduce the occurrence of 'false positives', the controller interface with the peripheral circuitry can make use of any available information regarding memory block write operations. For example, in the case that a "read before write" scheme is used, in which only changed bits are written, the sacrificial memory cell would only be stressed if one or more bits in the associated sub-block are changed.

Similarly, if a "self-terminating" scheme is used, in which circuitry terminates a write operation once completion of the switching operation detected, the termination information may be used to control the duration of the stressing signal to the sacrificial memory cells.

Figure 11:
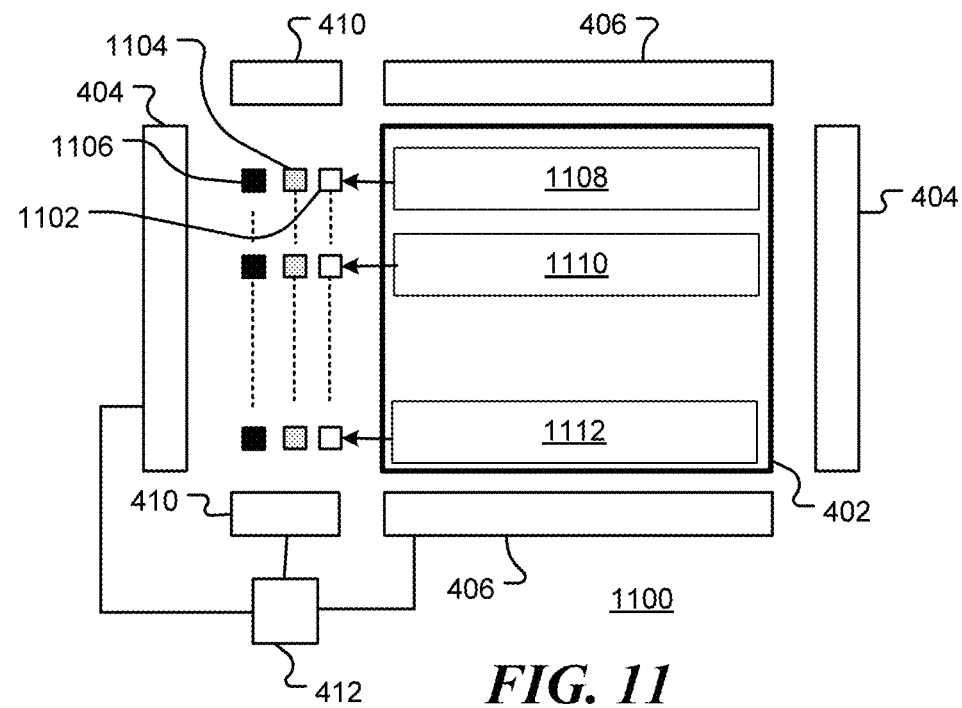
FIG. 11 is a diagrammatic representation of an integrated circuit memory device including sacrificial memory cells with different properties, in accordance with embodiments of the disclosure.

FIG. 11 is a diagrammatic representation of an integrated circuit memory device 1100, in accordance with embodiments of the disclosure. Device 1100 includes a primary memory array 402 and associated peripheral circuitry. The peripheral circuitry includes row circuitry 404, such as word lines coupled to rows of the memory array, and column circuitry 406, such as bit lines coupled to columns of the memory array. Sacrificial memory cells are provided for failure prediction. The sacrificial memory cells are accessed and stressed by peripheral circuitry 404 and 410. Each row of sacrificial memory cells is associated with a sub-region of the primary memory array 402. For example, sacrificial memory cells 1102, 1104 and 1106 are associated with memory sub-region 1108. Other sacrificial cells are associated with sub-region 1110, and still further cells associated with sub-region 1112. In one embodiment, the sacrificial cells with different failure properties are associated with each sub-region. For example, the cells may be fabricated to have different levels of durability, so that cells of one type are likely to fail faster. In the event of failure of a sacrificial memory, difference actions may be taken depending on the type of the cells, with more aggressive action taken when a more durable cell fails.

Figure 12:
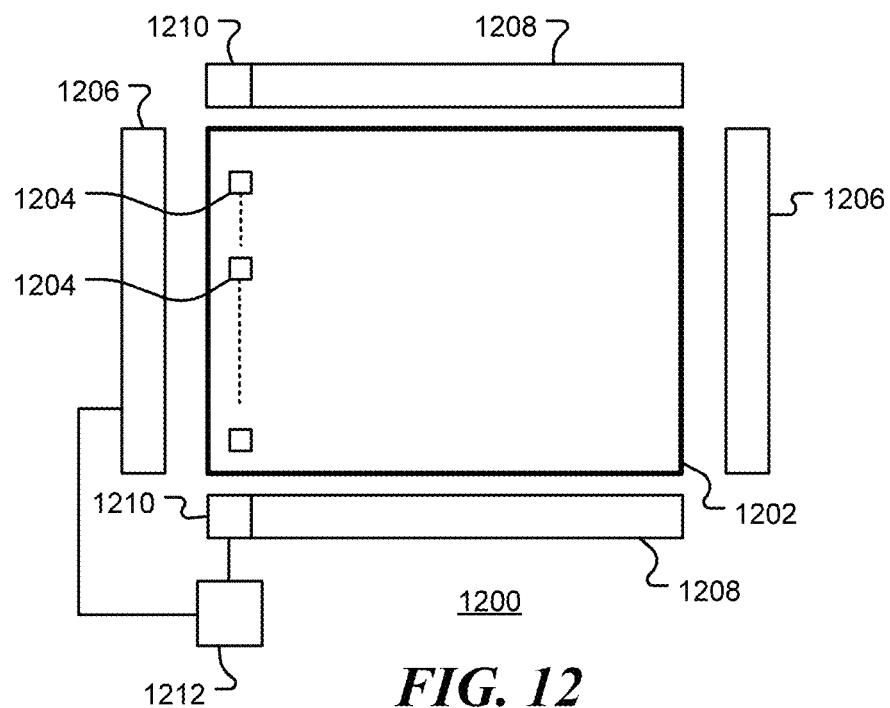
FIG. 12 is a diagrammatic representation of an integrated circuit memory device in which a memory array includes sacrificial memory cells, in accordance with embodiments of the disclosure.

FIG. 12 is a diagrammatic representation of an integrated circuit memory device 1200, in accordance with embodiments of the disclosure. In this embodiment, memory array 1202 includes both primary memory cells and sacrificial memory cells 1204. Also, peripheral circuitry 1206 and 1208 includes circuitry for both the primary memory cells and the sacrificial cells. Controller 1212 may also be integrated with the peripheral circuitry.

Figure 13:
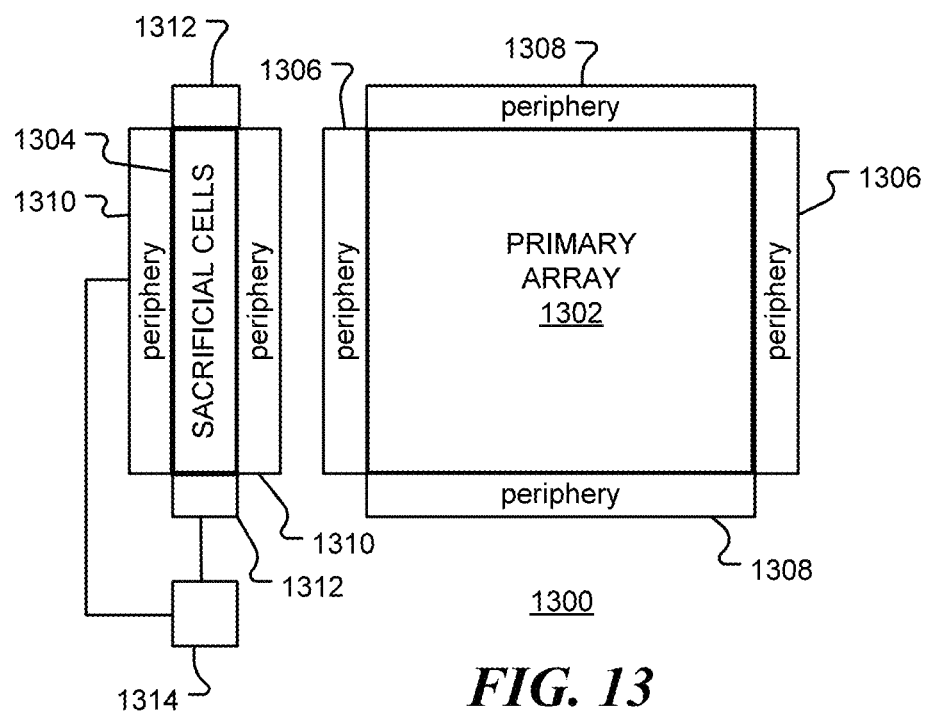
FIG. 13 is a diagrammatic representation of an integrated circuit memory device including sacrificial memory cells, in accordance with embodiments of the disclosure.

FIG. 13 is a diagrammatic representation of an integrated circuit memory device 1300 including sacrificial memory cells, in accordance with embodiments of the disclosure. In this embodiment, the primary memory array 1302 and the sacrificial memory cells 1304 are fabricated as separate modules. Primary memory array 1302 is accessed via peripheral circuitry 1306 and 1308, while the sacrificial memory cells 1304 are accessed via peripheral circuitry 1310 and 1312. Controller 1314 controls when and how sacrificial memory cells 1304 are stressed and monitors cell failures. Thus, the failure prediction circuitry may be highly integrated with the primary memory array or provided as a standalone module close to the primary memory array.

The failure prediction system disclosure above enables prediction of endurance-failures in primary memory array by locating sacrificial memory cells close to the block memories. The sacrificial memory cells are fabricated and/or stressed such that, in operation, they fail before cells of the primary memory array.

The failure prediction system is subject to the same process variations and temperature variations as the primary memory array, enabling a more accurate prediction of endurance failure.

The failure prediction system may integrated with the peripheral circuitry of the primary memory array, enabling more detailed write information to be used to control the application of stresses to the sacrificial memory cells.

The disclosed failure prediction system can be used in different types of memory, including volatile and non-volatile memory, capacitive memory and resistive memory.

In one embodiment, the sacrificial memory cells are fabricated such that they are expected to fail before cells in the primary memory array (given the same amount of stress). For most types of memory, the relationship between cell fabricated parameters and endurance is known. It particular, it is usually known whether variation of a particular parameter, such as layer thickness or cross-sectional area, how will affect endurance. This information may be used to determine the fabrication parameter values for the sacrificial memory cells.

In the case that temperature conditions impose a hard constraint on the sacrificial memory cell functioning, an external temperature sensor can calibrate the over-stress applied to the sacrificial memory cells.

As described before, sacrificial memory cell control can be programmed externally, altering the trimming values that determine the sacrificial cell operation point based on corners etc.

Due to fabrication variations, the sacrificial memory cells and primary memory cells may have different endurance levels. In one embodiment a group of sacrificial memory cells are used to monitor a memory array or a sub-block of the array. Endurance failure is predicted from the performance of the group, rather than by the failure of a single sacrificial memory cell.

The monitoring information from the sacrificial memory cells may be used for other purposes, such as wear-leveling.

In this document, relational terms such as first and second, top and bottom, and the like may be used solely to distinguish one entity or action from another entity or action without necessarily requiring or implying any actual such relationship or order between such entities or actions. The terms "comprises," "comprising," "includes," "including," "has," "having," or any other variations thereof, are intended to cover a non-exclusive inclusion, such that a process, method, article, or apparatus that comprises a list of elements does not include only those elements but may include other elements not expressly listed or inherent to such process, method, article, or apparatus. An element preceded by "comprises . . . a" does not, without more constraints, preclude the existence of additional identical elements in the process, method, article, or apparatus that comprises the element.

Reference throughout this document to "one embodiment," "certain embodiments," "an embodiment," "implementation(s)," "aspect(s)," or similar terms means that a particular feature, structure, or characteristic described in connection with the embodiment is included in at least one embodiment of the present disclosure. Thus, the appearances of such phrases or in various places throughout this specification are not necessarily all referring to the same embodiment. Furthermore, the particular features, structures, or characteristics may be combined in any suitable manner in one or more embodiments without limitation.

The term "or", as used herein, is to be interpreted as an inclusive or meaning any one or any combination. Therefore, "A, B or C" means "any of the following: A; B; C; A and B; A and C; B and C; A, B and C". An exception to this definition will occur only when a combination of elements, functions, steps or acts are in some way inherently mutually exclusive.

As used herein, the term "configured to", when applied to an element, means: (i) the element may be designed or constructed to perform a designated function, or (ii) the element has the required structure to enable it to be reconfigured or adapted to perform that function.

Numerous details have been set forth to provide an understanding of the embodiments described herein. The embodiments may be practiced without these details. In other instances, well-known methods, procedures, and components have not been described in detail to avoid obscuring the embodiments described. The disclosure is not to be considered as limited to the scope of the embodiments described herein.

Those skilled in the art will recognize that the present disclosure has been described by means of examples. The present disclosure could be implemented using hardware component equivalents such as special purpose hardware and/or dedicated processors which are equivalents to the present disclosure as described and claimed. Similarly, dedicated processors and/or dedicated hard wired logic may be used to construct alternative equivalent embodiments of the present disclosure.

Dedicated or reconfigurable hardware components used to implement the disclosed mechanisms may be described, for example, by instructions of a hardware description language (HDL), such as VHDL, Verilog or RTL (Register Transfer Language), or by a netlist of components and connectivity. The instructions may be at a functional level or a logical level or a combination thereof. The instructions or netlist may be input to an automated design or fabrication process (sometimes referred to as high-level synthesis) that interprets the instructions and, based on the interpreted instructions, creates digital hardware that implements the described functionality or logic.

The HDL instructions or the netlist may be stored on non-transitory computer readable medium such as Electrically Erasable Programmable Read Only Memory (EEPROM); non-volatile memory (NVM); mass storage such as a hard disc drive, floppy disc drive, optical disc drive; optical storage elements, magnetic storage elements, magneto-optical storage elements, flash memory, core memory and/or other equivalent storage technologies without departing from the present disclosure. Such alternative storage devices should be considered equivalents.

Various embodiments described herein are implemented using dedicated hardware, configurable hardware or programmed processors executing programming instructions that are broadly described in flow chart form that can be stored on any suitable electronic storage medium or transmitted over any suitable electronic communication medium. A combination of these elements may be used. Those skilled in the art will appreciate that the processes and mechanisms described above can be implemented in any number of variations without departing from the present disclosure. For example, the order of certain operations carried out can often be varied, additional operations can be added or operations can be deleted without departing from the present disclosure. Such variations are contemplated and considered equivalent.

The various representative embodiments, which have been described in detail herein, have been presented by way of example and not by way of limitation. It will be understood by those skilled in the art that various changes may be made in the form and details of the described embodiments resulting in equivalent embodiments that remain within the scope of the appended claims.

The invention claimed is:

1. An integrated circuit, comprising:
   a non-volatile memory (NVM) array including a plurality of rows, each row including a plurality of NVM cells, each NVM cell configured to be switchable between a first state and a second state in response to a write operation;
   a plurality of sacrificial NVM cells configured to be switchable between the first state and the second state, each sacrificial NVM cell associated with at least one row of the NVM array; and
   a controller configured to:
     detect a write operation to a row of the NVM array;
     stress, based on the write operation, sacrificial NVM cells associated with said row, including:
       switch a first sacrificial NVM cell from the first state to the second state for a write operation that switches an NVM cell of the row from the first state to the second state, and
       switch a second sacrificial NVM cell from the second state to the first state for a write operation that switches an NVM cell of the row from the second state to the first state; and
     detect a failure of the first or second associated sacrificial NVM cell to switch states.

2. The integrated circuit of claim 1, where failure of at least one row of the NVM array is predicted based, at least in part, on a detected failure of the associated sacrificial NVM cell.

3. The integrated circuit of claim 1, where the sacrificial NVM cells have a lower write-cycle endurance than the NVM array cells, and where different sacrificial NVM cells have similar or different levels of write-cycle endurance.

4. The integrated circuit of claim 3, where:
   the sacrificial NVM cells and the NVM array cells each include a stack having a cross-dimension and an oxide layer, and
   the sacrificial NVM cells have a thinner oxide layer or a smaller cross-dimension than the NVM array cells.

5. The integrated circuit of claim 1, where the controller is configured to stress said associated sacrificial NVM cells more often than the write operation is detected.

6. The integrated circuit of claim 1, further comprising circuitry configured to provide a switching pulse to the sacrificial NVM cells, the switching pulse having a higher level or longer duration than a switching pulse applied during a write operation to the NVM array.

7. The integrated circuit of claim 1, where the sacrificial NVM cells are located in proximity to the NVM array.

8. The integrated circuit of claim 1, where each row of the NVM array contains one or more words, each NVM cell represents one bit of a word, and the sacrificial NVM cells are associated with the words of the NVM array.

9. The integrated circuit of claim 1, where the NVM array includes a plurality of sub-regions, and where each sub-region of the NVM array is associated with a plurality of sacrificial NVM cells.

10. The integrated circuit of claim 1, where the sacrificial NVM cells and the NVM array cells include magneto-resistive random access memory (MRAM), phase change memory (PCM), resistive random access memory (RRAM) or correlated electron random access memory (CeRAM).

11. The integrated circuit of claim 1, further comprising:
peripheral circuitry coupled to the NVM array and configured to perform write operation thereon,
where the controller is integrated with the peripheral circuitry.

12. A method, comprising:
detecting a write operation to a row of a non-volatile memory (NVM) array, the row including a plurality of NVM cells, the write operation switching one or more NVM cells of the row from a first state to a second state or from the second state to the first state;
switching, based on the detected write operation, sacrificial NVM cells associated with said row, the switching including:
switching a first sacrificial NVM cell from the first state to the second state for a write operation that switches an NVM cell of the row from the first state to the second state, and
switching a second sacrificial NVM cell from the second state to the first state for a write operation that switches an NVM cell of the row from the second state to the first state; and
detecting a failure of the first or second associated sacrificial NVM cell to switch states.

13. The method of claim 12, further comprising:
predicting, based at least in part on a detected failure of one or more sacrificial NVM cells, failure of said row.

14. The method of claim 13, further comprising:
signaling the predicted failure of said row.

15. The method of claim 13, further comprising:
relocating, in response to predicted failure of said row, data from said row to another row of the NVM array.

16. The method of claim 12, where:
switching a NVM cell of the row between the first state and the second state includes applying a first switching pulse to the NVM cell,
switching a sacrificial NVM cell of the one or more sacrificial NVM cells between the first state and the second state includes applying a second switching pulse to the sacrificial NVM cell, and
the second switching pulse has a higher level or longer duration than the first switching pulse.

17. The method of claim 12, where said switching the one or more sacrificial NVM cells of the integrated circuit between the first state and the second state is performed more frequently than the write operation is detected.

18. A method, comprising:
at a controller coupled to an NVM array and a plurality of sacrificial NVM cells, the NVM array including a plurality of rows, each row including a plurality of NVM cells:
automatically associating, based on a detected operating condition of the NVM array, at least one sacrificial NVM cell to each row of the NVM array;
detecting a write operation to a row of the NVM array, the write operation switching one or more NVM cells of the row between a first state and a second state;
switching, based on the detected write operation, an associated sacrificial NVM cell between the first state and the second state; and
detecting a failure of the associated sacrificial NVM cell to switch between the first state and the second state.

* * * * *